United States Patent
Kang

(10) Patent No.: US 7,123,536 B2
(45) Date of Patent: Oct. 17, 2006

(54) VOLTAGE GENERATION CONTROL CIRCUIT IN SEMICONDUCTOR MEMORY DEVICE, CIRCUIT USING THE SAME AND METHOD THEREOF

(75) Inventor: Sang Hee Kang, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/908,534

(22) Filed: May 16, 2005

(65) Prior Publication Data

US 2006/0120195 A1    Jun. 8, 2006

(30) Foreign Application Priority Data

Dec. 6, 2004    (KR)    ............ 10-2004-0101785

(51) Int. Cl.
   *G11C 7/00* (2006.01)
(52) U.S. Cl. ............ 365/226; 365/194; 365/189.03
(58) Field of Classification Search ............ None
   See application file for complete search history.

(56) References Cited

U.S. PATENT DOCUMENTS

| | | | | |
|---|---|---|---|---|
| 5,995,429 A | * | 11/1999 | Kojima et al. ............ | 365/201 |
| 6,079,023 A | | 6/2000 | Yoon et al. ............ | 713/300 |
| 6,115,319 A | * | 9/2000 | Kinoshita et al. ............ | 365/233 |
| 6,182,192 B1 | * | 1/2001 | Rovati ............ | 365/191 |
| 6,292,420 B1 | | 9/2001 | Kim et al. ............ | 365/222 |
| 6,404,677 B1 | | 6/2002 | Lee ............ | 365/185.2 |
| 6,590,813 B1 | | 7/2003 | Shiga ............ | 365/189.09 |
| 6,639,828 B1 | | 10/2003 | Itoh et al. ............ | 365/156 |
| 6,735,726 B1 | * | 5/2004 | Muranaka et al. ............ | 365/200 |
| 6,823,485 B1 | * | 11/2004 | Muranaka ............ | 365/201 |
| 6,842,382 B1 | | 1/2005 | Kim et al. ............ | 365/189.09 |
| 2001/0003508 A1 | | 6/2001 | Lee ............ | 365/185.02 |
| 2003/0035325 A1 | | 2/2003 | Kim et al. ............ | 365/189.09 |
| 2005/0141310 A1 | * | 6/2005 | Lee et al. ............ | 365/222 |

FOREIGN PATENT DOCUMENTS

| | | |
|---|---|---|
| DE | 10237995 | 3/2003 |
| JP | 2001035150 | 2/2001 |
| JP | 2001176287 | 6/2001 |
| JP | 2003085977 | 3/2003 |

* cited by examiner

*Primary Examiner*—Thong Q. Le
(74) *Attorney, Agent, or Firm*—Marshall, Gerstein & Borun LLP

(57) ABSTRACT

A voltage generation control circuit of a semiconductor memory device and method thereof are provided. A period tD, which is delayed for a given time after an internal row active time (tRAS) is secured since an active command is input, is set as an active operating period. An internal latency period, a burst length period and a latency delay period tDLT are set as a read/write operating period after a read/write command is input. A period tDRP delayed for a given time after a precharge command is input is set as a precharge operating period. In this state, a voltage generator is controlled to generate an active voltage only in the operating periods.

28 Claims, 8 Drawing Sheets

VOLTAGE GENERATION CONTROL CIRCUIT IN SEMICONDUCTOR MEMORY DEVICE, CIRCUIT USING THE SAME AND METHOD THEREOF

BACKGROUND

This disclosure relates generally to a semiconductor memory device, and, more specifically, to a voltage generation control circuit in a semiconductor memory device and method thereof, wherein a voltage generator is controlled to generate an internal voltage only in a period where a substantial operation is performed.

FIG. 1 is a block diagram of a conventional circuit for controlling voltage generation. The voltage generation control circuit includes a command decoder & row control unit 10, an active voltage generation control unit 20, an active voltage generation unit 30, and a standby voltage generation unit 40.

The command decoder & row control unit 10 uses an external command CMD and a bank address BA to generate a row active-related control signal.

The active voltage generation control unit 20 receives row active signals RACTP<0:3> and row precharge signals RPCGBP<0:3> from the command decoder & row control unit 10, and generates active voltage generation control signals ACT_CTR<0:3> for controlling the operation (whether to generate active voltage) of the active voltage generation unit 30.

The active voltage generation unit 30 uses the active voltage generation control signal ACT_CTR and a reference voltage REF to generate an internal active voltage VINT_ACT.

The standby voltage generation unit 40 uses a bias voltage VBIAS and a reference voltage REF to generate an internal standby voltage VINT_STB, and is always enabled if it is not a special test condition after power-up.

FIG. 2 is a detailed circuit diagram of an active voltage generation control unit 20 shown in FIG. 1. Referring to FIG. 2, the active voltage generation control unit 20 includes PMOS transistors P1, P2, a NMOS transistor N1, inverter latches IV1, IV2, an inverter IV3, a delay unit 21, a NAND gate ND1, and inverters IV4, IV5.

If row active signals RACTP<0:3> are a high pulse, the NMOS transistor N1 is turned on and a node NA thus becomes a low level. The active voltage generation control signals ACT_CTR<0:3> are enabled to a high level. At this time, the active voltage generation unit 30 is enabled to generate the internal active voltage VINT_ACT. Thereafter, if the row precharge signals RPCGBP<0:3> are a low pulse, the PMOS transistor P1 is turned on, and the node NA thus becomes a high level. The active voltage generation control signals ACT_CTR<0:3> are disabled to a low level after delay Td. At this time, the active voltage generation unit 30 is disabled and does not operate.

FIG. 3 is a timing diagram showing waveforms of signals of the circuit for controlling voltage generation shown in FIG. 1. Referring to FIG. 3, if a bank address BA, a row address RA, and an active command ACT are input in synchronism with a rising edge of a clock signal CLK, a row active signal RACTP of a corresponding bank is generated as a high pulse, and the active voltage generation control signal ACT_CTR is enabled from a low level to a high level, so that the active voltage generation unit 30 operates to generate the internal active voltage VINT_ACT. Then, if the bank address BA and a precharge command PCG are input, the row precharge signal RPCGBP is generated as a low pulse. After delay Td, the active voltage generation control signal ACT_CTR is disabled to a low level, so that the active voltage generation unit 30 does not operate. That is, the active voltage generation unit 30 operates when the active command ACT is received, but does not operate after predetermined delay if the precharge command PCG is received.

The conventional active voltage generation unit 30 constructed above always operates even in a period where no operation is performed after being activated by the active command ACT, thus generating an active voltage. As a result, unnecessary current is consumed.

SUMMARY

In one aspect, the invention is directed to a voltage generation control circuit of a semiconductor memory device having a plurality of banks. The voltage generation control circuit includes a plurality of voltage generation control units configured to generate a plurality of voltage generation control signals, which are allocated to the plurality of the banks, respectively, and are activated only in a predetermined active operating period, a predetermined read/write operating period, and/or a predetermined precharge operating period. A voltage generator configured to generate an internal voltage only in the operating period in response to a voltage generation control signal output from a voltage generation control unit allocated to one of the plurality of the banks.

In another aspect, the invention is directed to a voltage generation control circuit of a semiconductor memory device having a voltage generator for generating an internal voltage. The voltage generation control circuit includes a voltage generation control unit which is configured to set a period, which is delayed for a given time after internal tRAS is secured since an active command is input, as an active operating period, configured to set an internal latency period, a burst length period and a latency delay period as a read/write operating period after a read/write command is input, configured to set a period delayed for a given time after a precharge command is input as a precharge operating period, and configured to control the voltage generator to generate the internal voltage only in the operating periods.

In a further aspect, the invention is directed to a voltage generation control method of a semiconductor memory device including a voltage generator that generates an internal voltage. The method includes setting a period delayed after internal tRAS is secured since an active command is input as an active operating period, setting an internal latency period, a burst length period, and a latency delay period as a read/write operating period after a read/write command is input, setting a period delayed for a predetermined time after a precharge command is input as a precharge operating period, and allowing the voltage generator to generate the internal voltage only in the operating period.

DETAILED DESCRIPTION

The operation of a DRAM is largely divided into a row operation and a column operation. The row operation is subdivided into an active operation and a precharge operation. The column operation is subdivided into a read operation and a write operation. Auto refresh and self-refresh operations are considered as a combination of the active operation and the precharge operation being the row operation. An auto precharge operation is considered as a combination of the active operation, the read/write operation and the precharge operation.

After an active command is input, an active operating period is set to a period which is delayed for a predetermined time at least as much as a period of tD after a tRAS (row active time) is secured. Internal latency, a burst length, and a latency delay period tDLT are set to a read/write operating period after a read/write command is input. A period tDRP that is delayed for a given time after a precharge command is input is set to a precharge operating period. An active voltage generation unit is controlled to generate an active voltage only in these periods.

Figure 1:
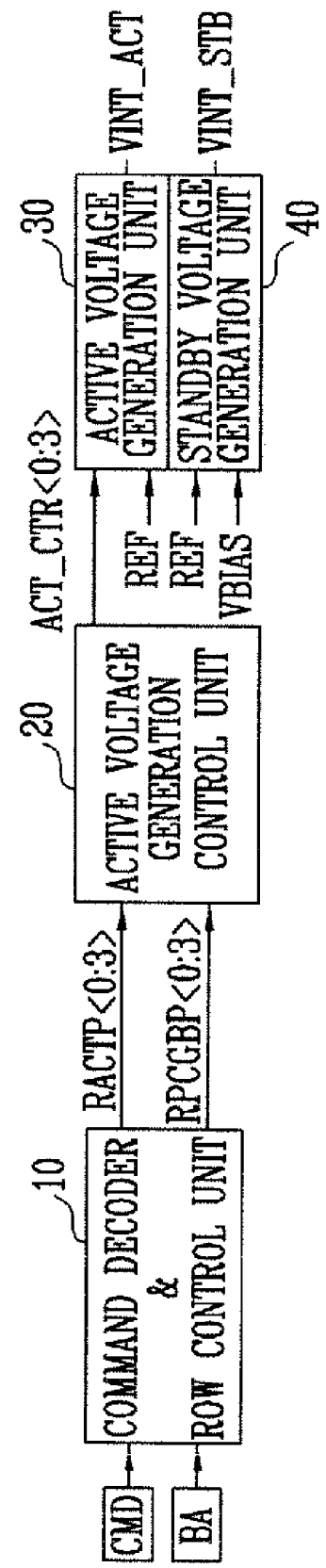
FIG. 1 is a block diagram of a conventional voltage generation control circuit.
Figure 2:
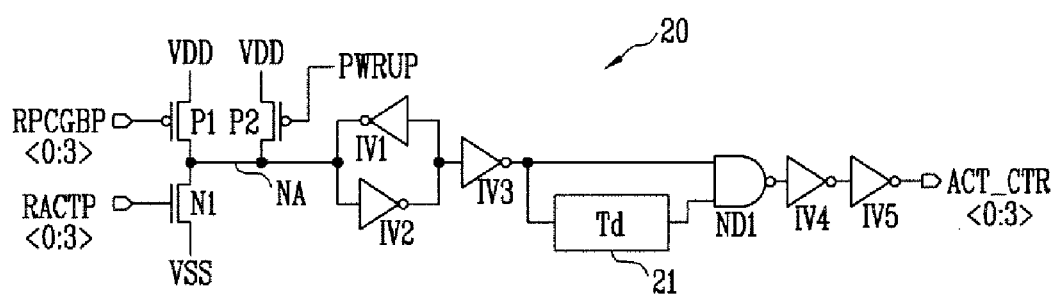
FIG. 2 is a detailed circuit diagram of an active voltage generation control unit shown in FIG. 1.
Figure 3:
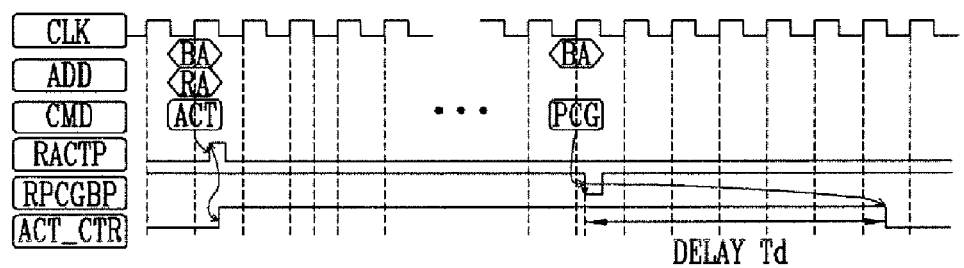
FIG. 3 is a timing diagram showing waveforms of signals of the circuit for controlling voltage generation shown in FIG. 1.
Figure 4:
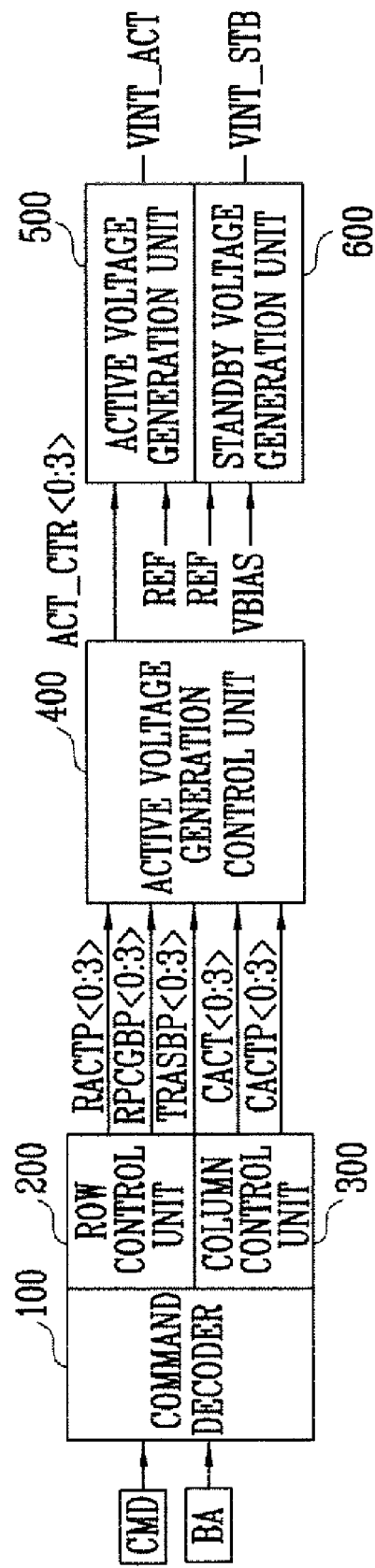
FIG. 4 is a block diagram of a circuit for controlling voltage generation.

FIG. 4 is a block diagram illustrating an example of a circuit for controlling voltage generation, wherein an active voltage generation unit generates an active voltage only in the aforementioned operating period. Referring to FIG. 4, the circuit for controlling voltage generation includes a command decoder 100, a row control unit 200, a column control unit 300, an active voltage generation control unit 400, an active voltage generation unit 500, and a standby voltage generation unit 600.

The command decoder 100 receives an external command CMD and a bank address BA. The row control unit 200 generates row active-related control signals such as a row active signal RACTP<0:3>, row precharge signals RPCGBP<0:3>, and row active time guarantee signals TRASBP<0:3>. The column control unit 300 generates column active-related control signals such as burst length information signals CACT<0:3> and column active signals CACTP<0:3>.

The active voltage generation control unit 400 receives the row active signals RACTP<0:3>, the row precharge signals RPCGBP<0:3>, and the row active time guarantee signals TRASBP<0:3> from the row control unit 200. The active voltage generation control unit 400 also receives the burst length information signals CACT<0:3> and the column active signals CACTP<0:3> from the column control unit 300. The active voltage generation control unit 400 generates active voltage generation control signals ACT_CTR<0:3>, which controls the active voltage generation unit 500 to generate an internal active voltage VINT_ACT only in a period where a substantial operation is performed.

The active voltage generation unit 500 generates the active voltage VINT_ACT only in periods where a substantial operation is performed, such as the active operating period, the read/write operating period, and the precharge operating period in response to the active voltage generation control signals ACT_CTR<0:3>.

The standby voltage generation unit 600 uses a bias voltage VBIAS and a reference voltage REF to generate a standby voltage VINT_STB.

Figure 5:
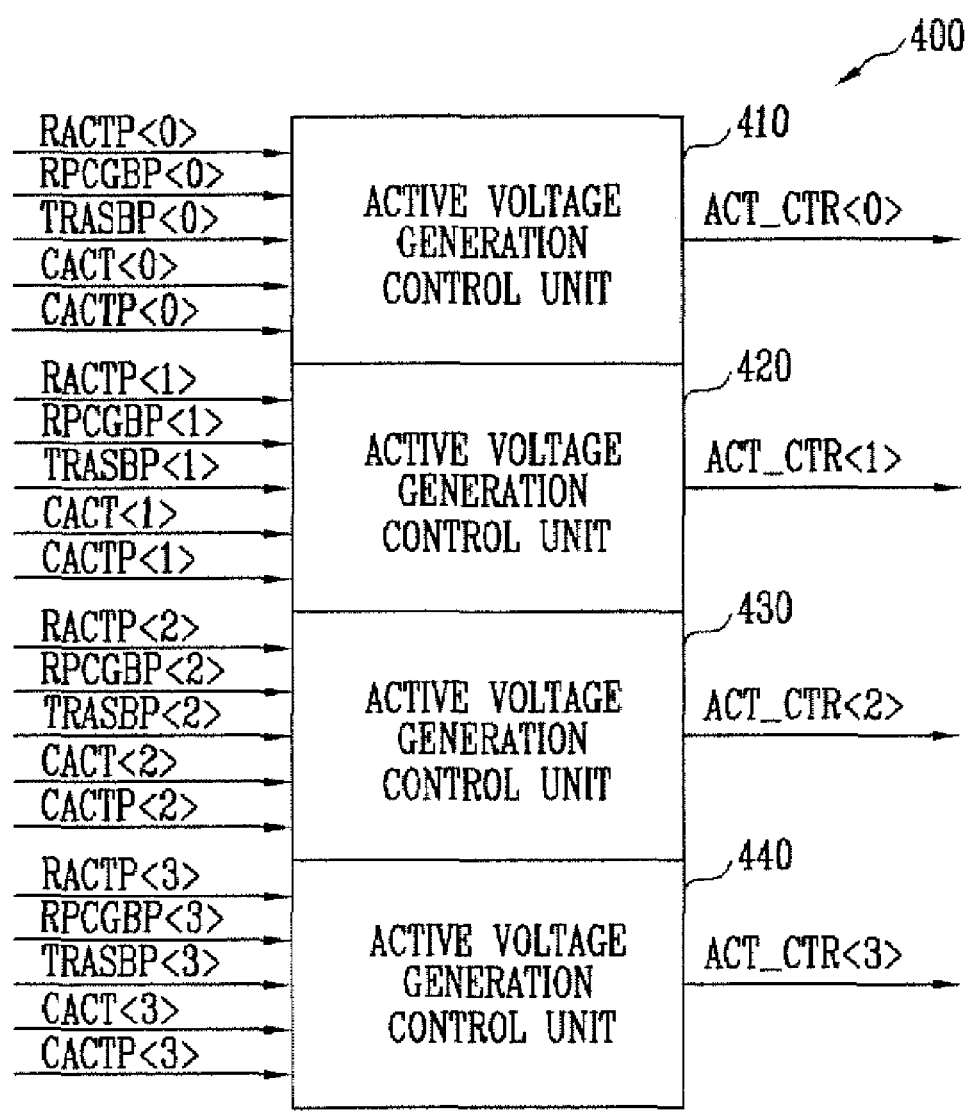
FIGS. 5 and 6 are detailed block diagrams of the active voltage generation control unit shown in FIG. 4.

FIG. 5 illustrates examples of the first through fourth active voltage generation control units 410, 420, 430, 440 of the active voltage generation control unit 400 shown in FIG. 4. The first through fourth active voltage generation control units 410, 420, 430, 440 are allocated to a bank 1 through a bank 4 (not shown) by a 1:1 ratio. In this case, even when an N number of banks exist, an N number of active voltage generation control units are allocated to the N number of the banks, respectively.

Referring to FIG. 5, the active voltage generation control unit 410 allocated to the bank 1 uses the row active signal RACTP<0>, the row precharge signal RPCGBP<0>, the row active time guarantee signal TRASBP<0>, the burst length information signal CACT<0>, and the column active signal CACTP<0> to generate the active voltage generation control signal ACTCTR<0>.

The active voltage generation control unit 420 allocated to the bank 2, the active voltage generation control unit 430 allocated to the bank 3, and the active voltage generation control unit 440 allocated to the bank 4 operate in the same manner as the active voltage generation control unit 410.

Figure 6:
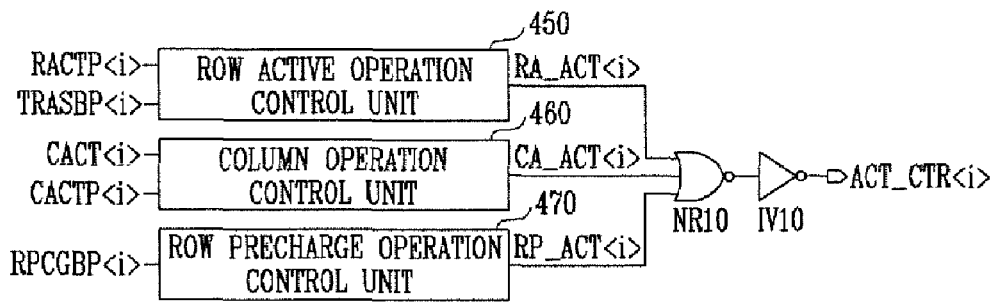

FIG. 6 is a block diagram illustrating an example of the configuration of each of the active voltage generation control units 410, 420, 430, 440 shown in FIG. 5. In FIG. 6, the operation of a DRAM is largely divided into an active operation, a read/write operation, and a precharge operation. The active operation and the precharge operation are classified as a row operation, and the read/write operation is classified as a column operation.

A row active operation control unit 450 uses the row active signal RACTP<i> and the row active time guarantee signal TRASBP<i> for guaranteeing the tRAS (row active time) to generate the active operating signal RA_ACT<i>.

A column operation control unit 460 uses the burst length information signal CACT<i> and the column active signal CACTP<i> to generate the column operation, i.e., read/write operation signal CA_ACT<i>.

At this time, the burst length information signal CACT<i> serves to perform the column operation (read/write operation) on a corresponding bank after a predetermined latency (designated in specification) after the read or write command is input, and it has burst length information. The column active signal CACTP<i> is a pulse signal that is generated immediately after a column command is input, and has bank information.

A row precharge operation control unit 470 uses the row precharge signal RPCGBP<i> to generate the precharge operating signal RP_ACT<i>. The row precharge signal RPCGBP<i> is a pulse signal that is generated immediately after a precharge command is input.

A NOR gate NR10 outputs a low level if any one of the active operating signal RA_ACT<i>, the read/write operation signal CA_ACT<i> and the precharge operating signal RP_ACT<i> is enabled as a high pulse. An inverter IV10 inverts the low level from the NOR gate NR10, and outputs the active voltage generation control signal ACT_CTR<i> of a high level. As such, the active voltage generation unit 500 is enabled to generate the internal active voltage VINT_ACT.

Figure 7:
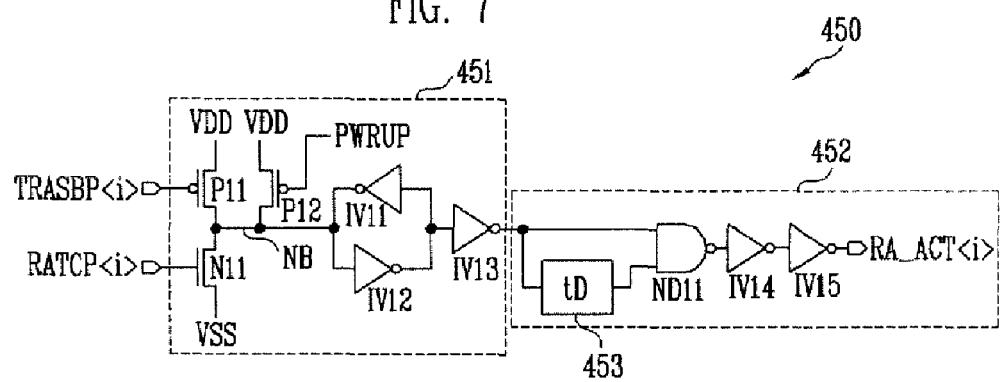
FIG. 7 is a detailed circuit diagram of the row active operation control unit shown in FIG. 6.

FIG. 7 is a detailed circuit diagram of an example of the row active operation control unit shown in FIG. 6. Referring to FIG. 7, the row active operation control unit 450 includes a latch 451 and a delay unit 452.

The latch 451 serves to latch the row active signal RACTP<i> and the row active time guarantee signal TRASBP<i>, and includes PMOS transistors P11, P12, a NMOS transistor N11, inverter latches IV11, IV12, and an inverter IV3. The delay unit 452 serves to delay the output signal of the latch 451 and output the active operating signal RA_ACT<i>, and includes a disable delay unit 453, a NAND gate ND11, and inverters IV14, IV15.

The PMOS transistor P11 has one terminal connected to a power supply voltage VDD and the other terminal connected to a node NB, and has a gate to which the row active time guarantee signal TRASBP<i> is input. The NMOS transistor N11 has one terminal connected to the node NB and the other connected to a ground voltage VSS, and has a gate to which the row active signal RACTP<i> is input. The PMOS transistor P12 has one terminal connected to a power supply voltage VDD and the other terminal connected to the node NB, and has a gate to which a power-up signal PWRUP is input. The inverter latches IV11, IV12 latch the signal of the node NB. The inverter IV13 inverts the output signals of the inverter latches IV11, IV12. The disable delay unit 453 delays the output signal of the inverter IV13 as much as tD. The NAND gate ND11 performs an NAND operation on the output signal of the inverter IV13 and the output signal of the disable delay unit 453. The inverters IV14, IV15 temporarily store the output signal of the NAND gate ND11, and outputs the active operating signal RA_ACT<i>.

Hereinafter, the operation of the row active operation control unit 450 will be described with reference to FIG. 7. If an active command ACT is received (see FIG. 11 to be described later) and the row active signal RACTP<i> is received as a high pulse, the NMOS transistor N11 is instantly turned on, and the node NB thus becomes low level. The low level of the node NB is latched by the inverter latches IV1, IV2, are then output to the inverter IV13. The inverter IV13 inverts the high level to output low level. The NAND gate ND11 outputs the high level without delay. The inverters IV14, IV15 temporarily store the high level, and outputs the active operating signal RA_ACT<i> of the high level.

If the row active time guarantee signal TRASBP is received as a low pulse after about tRAS (row active time) elapses, the PMOS transistor P11 is instantly turned on, and the node NB becomes high level. The high level of the node NB is latched by the inverter latches IV1, IV2, and then output to the inverter IV13. The inverter IV13 inverts the low level to output high level. The NAND gate ND11 receives the high level of the inverter IV13 through its one input terminal, and receives the high level that is output from the disable delay unit 453 after being delayed by tD through the other input terminal, and then performs a NAND operation on the high levels to output low level. The inverters IV14, IV15 temporarily store the low level, and then output the active operating signal RA_ACT<i> of the low level. That is, the active operating signal RA_ACT<i> guarantees tRAS (row active time), and then becomes low level after being delayed if the row active time guarantee signal TRASBP<i> is generated. By doing so, the active voltage generation unit 500 is enabled only during the period tRAS+tD, thus generating the internal active voltage VINT_ACT, and is disabled after the period tRAS+tD, thereby not generating the internal active voltage VINT_ACT. The delay time tD is decided according to a time taken to stabilize the level of the internal power supply voltage.

Figure 8:
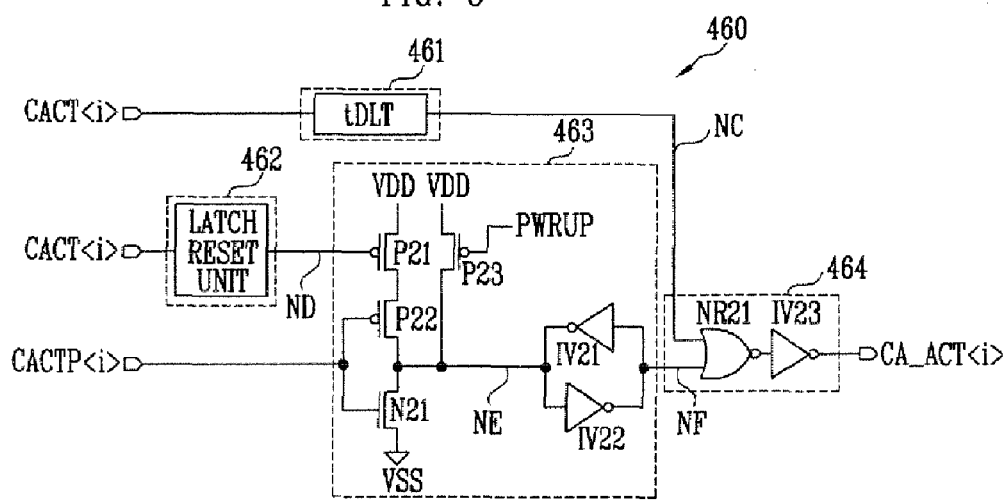
FIG. 8 is a detailed circuit diagram of the column operation control unit shown in FIG. 6.

FIG. 8 is a detailed circuit diagram of an example of the column operation control unit shown in FIG. 6. Referring to FIG. 8, the column operation control unit 460 includes a latency delay unit 461, a latch reset unit 462, a command latch unit 463, and a summing unit 464.

The latency delay unit 461 delays the burst length information signal CACT<i> as much as tDLT, and outputs the delayed signal to a node NC. That is, the latency delay unit 461 serves to keep a read/write operation signal CA_ACT<i> to a high level during a latency delay period after the burst operation is finished by using the burst length information signal CACT<i>. The burst length information signal CACT<i> is a signal, which causes a memory cell array to perform a column operation (a read/write operation) after predetermined latency since the column active signal CACTP<i> is generated.

The latch reset unit 462 resets the command latch unit 463 when the burst length information signal CACT<i> shifts from high to low after the burst operation is finished, and generates a low pulse.

The command latch unit 463 serves to latch the column active signal CACTP<i>, which is generated immediately after the column command RD/WT is input (see FIG. 11 to be described later). It includes PMOS transistors P21 to P23, a NMOS transistor N21, and inverter latches IV21, IV22.

The PMOS transistor P21 has one terminal connected to a power supply voltage VDD, and the other terminal connected to a node NE. The PMOS transitor P21 has a gate to which a signal of a node ND is input, and is thus turned on/off according to the signal. The PMOS transistor P22 and the NMOS transistor N21 are connected between the node NE and a ground voltage VSS in a serial manner, and have gates to which the column active signal CACTP<i> is input. The PMOS transistor P23 has one terminal connected to a power supply voltage VDD, and the other terminal connected to the node NE. The PMOS transistor P23 has a gate to which a power-up the signal PWRUP is input, and is thus turned on/off according to the signal. The inverter latches IV21 and IV22 latch a signal of the node NE.

The summing unit 464 sums the signal of the node NC and the signal of the node NF to output the read/write operation signal CA_ACT<i>. It includes a NOR gate NR21 and an inverter IV23. The NOR gate NR21 performs a NOR operation on the signal of the node NC and the signal of the node NF. The inverter IV23 inverts the output signal of the NOR gate NR21 to output the read/write operation signal CA_ACT<i>.

The operation of the column operation control unit 460 will be described with reference to FIG. 8. In a state where the burst length information signal CACT<i> is in a logic low level, if the column active signal CACTP<i> is input as a high pulse immediately after a first column command RW/WT is input, the NMOS transistor N21 is turned on, and the node NE becomes low level accordingly. The inverter latches IV21, IV22 latch the low level, and outputs the high level to the node NF. The NOR gate NR21 receives the high level through one of two inputs, and then outputs the low level. The inverter IV23 inverts the low level from the NOR gate NR21, and outputs the read/write operation signal CA_ACT<i> of the high level. At this time, the active voltage generation unit 500 is enabled to generate the internal active voltage VINT_ACT.

The command latch unit 463 keeps the read/write operation signal CA_ACT<i> to the high level until the burst length information signal CACT<i> becomes a high level. Thereafter, if the burst length information signal CACT<i> is enabled to high level after latency elapses, the burst length information signal CACT<i> keeps the read/write operation signal CA_ACT<i> to the high level regardless of an output signal of the command latch unit 463. If the burst length information signal CACT<i> is disabled to low level after the burst operation is finished, the signal of the node ND becomes a low pulse, and the PMOS transistor P21 is turned on, whereby the node NE becomes high level and the node NF becomes low level. Although the burst length information signal CACT<i> becomes low level, the signal of the node NC is delayed as much as tDLT and then becomes low level. The NAND gate NR21 receives the low level through its two inputs, and then outputs high level. The inverter IV23 inverts the high level from the NAND gate NR21, and outputs the read/write operation signal CA_ACT<i> of the low level. At this time, the active voltage generation unit 500 is disabled, and thus does not generate the internal active voltage VINT_ACT.

In other words, the active voltage generation control signal ACT_CTR is enabled to high level only during the period Latency+Burst Length+tDLT, and thus controls the active voltage generation unit 500 to operate only in the period.

Figure 9:
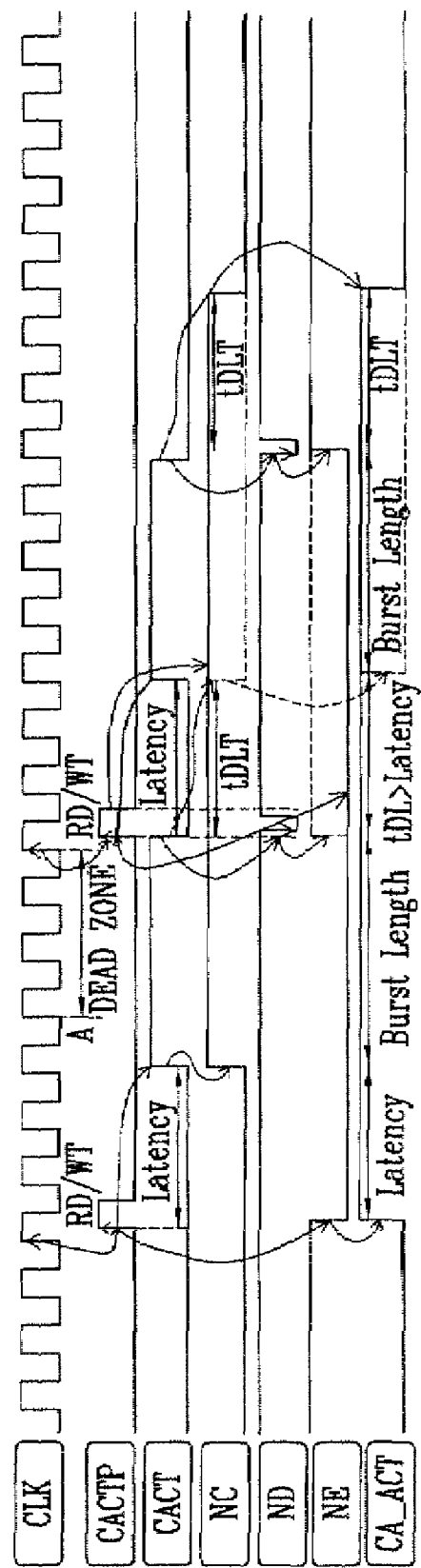
FIG. 9 is a timing diagram showing waveforms of signals of the column operation control unit shown in FIG. 8.

FIG. 9 is a timing dram showing waveforms of signals of the column operation control unit 460 shown in FIG. 8. Referring to FIG. 9, the latency is set to 3CLK (i.e., 3 clocks), and the burst length is set to 4CLK (i.e., 4 clocks). The second command RD/WT is issued as soon as the burst operation of the first command RD/WT is finished. A waveform indicated by dotted line in FIG. 9 indicates a waveform when the second command RD/WT is issued.

If the column active signal CACTP is generated a high pulse by means of the first command RD/WT, the read/write operation signal CA_ACT is enabled to high level while the signal of the node NE shifts from high level to low level. Thereafter, after latency of 3 clocks CLK, the burst length information signal CACT is enabled to high level, kept to the high level during 4 clocks CLK corresponding to the burst length, and then becomes low level. Actually, however, the signal of the node NC, which decides the level of the read/write operation signal CA_ACT, is further kept to the high level during tDLT. Thus, the read/write operation signal CA_ACT is also further kept to the high level during tDLT.

If the second command RD/WD is generated as a high pulse at a time point where the burst operation of the first command RD/WT is finished, the column active signal CACTP and the signal of the node ND overlap with each other. In this case, a new command RD/WD is set to have the priority by controlling a pulse width and a timing of each of the column active signal CACTP and the signal of the node ND so that the column active signal CACTP surrounds the signal of the node ND. By doing so, the time of tDLT can be reduced as much as one clock CLK. That is, tDLT is a parameter that determines how long the read/write operation signal CA_ACT will be kept to high level after the burst length information signal CACT becomes low level in a previous operation.

If the second command RD/WD is applied at a time point A, which is after 4 clocks CLK corresponding to a burst length beginning from the first command RD/WD without the delay time of tDLT, the burst length information signal CACT keeps the high level. If the command RD/WT is input at a clock CLK immediately after the time point A, the burst length information signal CACT becomes high level in one clock CLK, and the read/write operation signal CA_ACT also repeats turning-on and -off (high level and low level). The turning-on and -off is repeated so that the operational section is short and a distance between the commands RD/WT is irregular in term of the command RD/WT operation. Because the active voltage generation unit 500 needs a time until it is enabled to operate normally, however, it is difficult to turn on and off the read/write operation signal CA_ACT in synchronization with the column operation (read/write operation).

Accordingly, the active voltage generation unit 500 is kept enabled to high level during a predetermined time (i.e., the delay time of tDLT) although the burst length information signal CACT becomes low level. The dead zone refers to a period where the read/write operation signal CA_ACT repeats turning-on and -off if there is no delay time of tDLT.

The delay time of minimal tDLT is set to remove the dead zone, which results in tDTL≧Latency. If a new command RD/WD is input in the period of tDTL and the column active signal CACTP is generated as a high pulse, however, the column active signal CACTP is stored in the command latch unit 463 so that the read/write operation signal CA_ACT is kept to high level.

Figure 10:
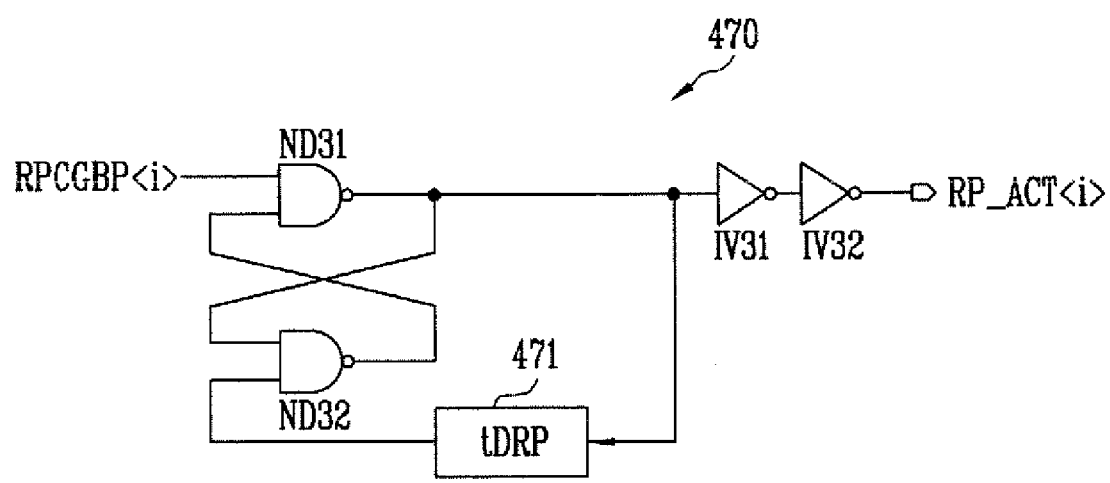
FIG. 10 is a detailed circuit diagram of the row precharge operation control unit shown in FIG. 6.

FIG. 10 is a detailed circuit diagram of an example of the row precharge operation control unit 470 shown in FIG. 6. Referring to FIG. 10, the row precharge operation control unit 470 includes NAND gate latches ND31, ND32, a delay unit 471, and inverters IV31, IV32. The NAND gate the latches ND31, ND32 latch a row precharge signal RPCGBP<i>. The delay unit 471 delays the output signal of the NAND latch as much as tDRP, and outputs the delayed signal as the input to the NAND latch again. The inverters IV31, IV32 temporarily store the output signal of the NAND latch, and then outputs a precharge operating signal RP_ACT<i>.

If a precharge command PCG is input (see FIG. 11 to be described later), the NAND latches ND31, ND32 receive the row precharge signal RPCGBP<i> of a low pulse, and output the signal of high level. The delay unit 471 delays the output signal of the NAND latch (i.e., the signal of the high level) as much as tDRP, and outputs the delayed signal as the input to the NAND latch. Then, the precharge operating signal RP_ACT<i> is kept to the high level during minimal tDRP, and then becomes low level.

Figure 11:
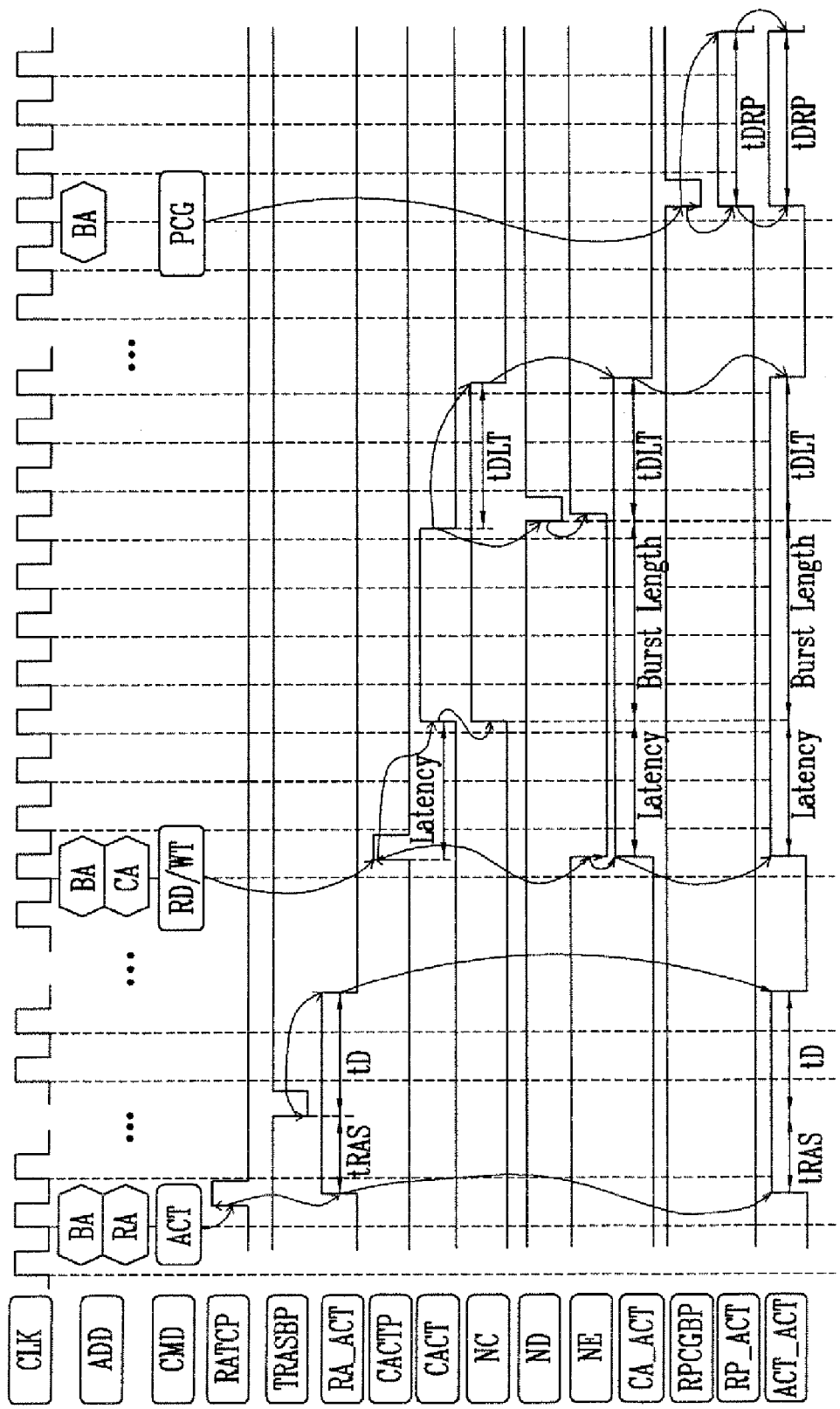
FIG. 11 a timing diagram showing waveforms of signals of a circuit for controlling voltage generation.

FIG. 11 shows a waveform of the operating signals shown in FIG. 4, which shows a waveform of signals when the active command ACT, the read/write commands RD/WD, and the precharge command PCG are applied.

Referring to FIG. 11, the active operating period, the read/write operating period, and the precharge operating period are sequentially executed. The active operating period is set to a period, which is delayed as much as tD after the active command ACT is input and internal tRAS is secured. The active voltage generation control signal ACT_CTR keeps high level only in an operating period, and becomes low level after the period. The read/write operating period is set to a period that is delayed as much as internal latency, burst length and tDLT after the read/write command RD/WD is input.

The active voltage generation control signal ACT_CTR keeps the high level only in the operating period, but becomes low level after the period. The precharge operating period is set to a period delayed as much as tDRP after the precharge command PCG is input. The active voltage generation control signal ACT_CTR again keeps the high level only in the operating period, but becomes low level after the period.

In other words, the active voltage generation control unit 400 controls the active voltage generation unit 500 to generate an active voltage only in the aforementioned periods tRAS+tD, latency+burst length+tDLT, and tDRP, but controls the active voltage generation unit 500 not to generate the active voltage in a period where nothing operation is performed after the active command ACT is input.

As described above, an active voltage generation unit generates an active voltage only in an actual operating period, but is disabled in a period having no operation after an active command is input. Accordingly, current that is unnecessarily consumed in an active voltage generation unit can be saved, and the performance of a product can be improved accordingly.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What invention claimed is:

1. A voltage generation control circuit of a semiconductor memory device having a plurality of banks, comprising:
    a plurality of voltage generation control units configured to generate a plurality of voltage generation control signals, which are allocated to the plurality of the banks, respectively, and are activated only in one or more operating periods including a predetermined active operating period, a predetermined read/write operating period, and a predetermined precharge operating period, in response to row active signals, row precharge signals, row active time guarantee signals, burst length information signals and column active signals; and
    a voltage generator configured to generate an internal voltage only in the one or more operating periods in response to a voltage generation control signal output from a voltage generation control unit allocated to one of the plurality of the banks.

2. The voltage generation control circuit as claimed in claim 1, wherein each of the plurality of the voltage generation control units are configured to set a period, which is delayed for a given time after an internal row active time (tRAS) is secured since an active command is input, as the active operating period, configured to set an internal latency period, a burst length period and a latency delay period as the read/write operating period after a read/write command is input, and configured to set a period delayed for a given time after a precharge command is input as the precharge operating period.

3. The voltage generation control circuit as claimed in claim 1, wherein each of the plurality of the voltage generation control units comprises:
    a row active operation control unit that generates an active operating signal for setting the active operating period by using the row active signal and the row active time guarantee signal;
    a column operation control unit that generates a read/write operation signal for setting the read/write operating period by using the column active signal and the burst length information signal;
    a row precharge operation control unit that generates a precharge operating signal for setting the precharge operating period by using the row precharge signal; and
    a summing unit that sums the active operating signal, the read/write operation signal, and the precharge operating signal to output the voltage generation control signal.

4. The voltage generation control circuit as claimed in claim 3, wherein the row active operation control unit comprises:
    a latch unit configured to latch the row active signal and the row active time guarantee signal; and
    a delay unit configured to delay the output signal of the latch unit for a predetermined time, and configured to output the active operating signal for setting the active operating period.

5. The voltage generation control circuit as claimed in claim 4, wherein the latch unit comprises:
    a first switching element configured to be turned on according to the row active signal, and configured to output a low level to a first node;
    a second switching element configured to be turned on according to the row active time guarantee signal, and configured to output a high, level to the first node;
    an inverter latch configured to latch the signal of the first node; and
    an inversion element configured to invert the output signal of the inverter latch.

6. The voltage generation control circuit as claimed in claim 4, wherein the delay unit comprises:
    a delay element configured to delay the output signal of the latch unit; and
    a logic element configured to logically combine the output signal of the latch unit and the output signal of the delay element.

7. The voltage generation control circuit as claimed in claim 3, wherein the column operation control unit comprises:
    a latency delay unit configured to delay the burst length information signal for a predetermined time;
    a latch unit configured to latch the column active signal;
    a reset unit configured to reset the latch unit in response to the burst length information signal; and
    a summing unit configured to sum the output signal of the latency delay unit and the output signal of the reset unit to output the read/write operation signal for setting the read/write operating period.

8. The voltage generation control circuit as claimed in claim 7, wherein the latch unit comprises:
    first and second switching elements configured to turn on/off according to the column active signal, and configured to output a low level to a first node;
    a third switching element, configured to turn on according to the burst length information signal, and configured to output a high level to the first node; and
    an inverter latch configured to latch the signal of the first node.

9. The voltage generation control circuit as claimed in claim 3, wherein the row precharge operation control unit comprises:
    a NAND gate latch configured to latch the row precharge signal to output the precharge operating signal; and
    a delay unit configured to delay the output signal of the NAND gate latch and configured to output the delayed signal to the input of the NAND gate latch.

10. A voltage generation control circuit of a semiconductor memory device having a voltage generator for generating an internal voltage, comprising:
 a voltage generation control unit,
  the voltage generation control unit being configured to set a period, which is delayed for a given time after an internal row active time (tRAS) is secured since an active command is input, as an active operating period,
  the voltage generation control unit being configured to set an internal latency period, a burst length period and a latency delay period as a read/write operating period after a read/write command is input,
  the voltage generation control unit being configured to set a period delayed for a given time after a precharge command is input as a precharge operating period, and
  the voltage generation control unit being configured to control the voltage generator to generate the internal voltage only in one or more of the operating periods.

11. The voltage generation control circuit as claimed in claim 10, wherein the voltage generation control unit comprises:
 a row active operation control unit configured to generate an active operating signal for setting the active operating period by using a row active signal and a row active time guarantee signal;
 a column operation control unit configured to generate a read/write operation signal for setting the read/write operating period by using a column active signal and a burst length information signal;
 a row precharge operation control unit configured to generate a precharge operating signal for setting the precharge operating period by using a row precharge signal; and
 a summing unit configured to sum the active operating signal, the read/write operation signal, and the precharge operating signal to output a voltage generation control signal for controlling whether to generate the voltage of the voltage generator.

12. The voltage generation control circuit as claimed in claim 11, wherein the row active operation control unit comprises:
 a latch unit configured to latch the row active signal and the row active time guarantee signal; and
 a delay unit configured to delay the output signal of the latch unit for a predetermined time, and configured to output the active operating signal.

13. The voltage generation control circuit as claimed in claim 11, wherein the column operation control unit comprises:
 a latency delay unit configured to delay the burst length information signal for a predetermined time;
 a latch unit configured to latch the column active signal;
 a reset unit configured to reset the latch unit in response to the burst length information signal; and
 a summing unit configured to sum the output signal of the latency delay unit and the output signal of the reset unit to output the read/write operation signal.

14. The voltage generation control circuit as claimed in claim 11, wherein the row precharge operation control unit comprises:
 a NAND gate latch configured to latch the row precharge signal to output the precharge operating signal; and
 a delay unit configured to delay the output signal of the NAND gate latch and configured to output the delayed signal to the input of the NAND gate latch.

15. A voltage generation control method of a semiconductor memory device including a voltage generator that generates an internal voltage, the method comprising:
 setting a period delayed after internal tRAS is secured since an active command is input as an active operating period;
 setting an internal latency period, a burst length period, and a latency delay period as a read/write operating period after a read/write command is input;
 setting a period delayed for a predetermined time after a precharge command is input as a precharge operating period; and
 allowing the voltage generator to generate the internal voltage only in the operating period.

16. The voltage generation control method as claimed in claim 15, further comprising generating a voltage generation control signal for controlling the voltage generator to generate the internal voltage only in the operating period.

17. The voltage generation control method as claimed in claim 15, wherein setting the active operating period comprises setting the active operating period by generating the active operating signal using a row active signal and a row active time guarantee signal.

18. The voltage generation control method as claimed in claim 15, wherein setting the read/write operating period comprises setting the read/write operating period by generating a read/write operation signal using a column active signal and a burst length information signal.

19. The voltage generation control method as claimed in claim 15, wherein setting the precharge operating period comprises setting the precharge operating period by generating a precharge operating signal using a row precharge signal.

20. A circuit of a semiconductor memory device for supplying an active voltage for a plurality of banks, comprising:
 a row control unit for generating first control signals;
 a column control unit for generating second control signals;
 a voltage generator for generating an active voltage and then supplying the active voltage to the banks; and
 a plurality of voltage generation control units corresponding to the respective banks, wherein the voltage generation control units output voltage generation control signals to the voltage generator according to the first and the second control signals so that the voltage generator is activated only in active period.

21. The circuit as claimed in claim 20, wherein the active period is classified into an active operating period, a read/write operating period and a precharge operating period, and each of the plurality of the voltage generation control units sets a period, which is delayed for a given time after internal tRAS is secured since an active command is input, as the active operating period, sets an internal latency period, a burst length period and a latency delay period as the read/write operating period after a read/write command is input, and a period delayed for a given time after a precharge command is input as the precharge operating period.

22. The circuit as claimed in claim 20, wherein the row control unit generates row active signals, row precharge signals and row active time guarantee signals, as the first control signals, and the column control unit generates burst length information signals and column active signals, as the second control signals.

23. The circuit as claimed in claim 22, wherein each of the plurality of the voltage generation control units comprises:

a row active operation control unit that generates an active operating signal for setting the active operating period by using the row active signal and the row active time guarantee signal;

a column operation control unit that generates a read/write operation signal for setting the read/write operating period by using the column active signal and the burst length information signal;

a row precharge operation control unit that generates a precharge operating signal for setting the precharge operating period by using the row precharge signal; and a summing unit that sums the active operating signal, the read/write operation signal, and the precharge operating signal to output the voltage generation control signal.

24. A circuit of a semiconductor memory device for supplying an active voltage for a plurality of banks, comprising:

a row control unit for generating first control signals;

a column control unit for generating second control signals;

a voltage generator including an active voltage generation unit for outputting an active voltage to the banks and a standby voltage generation unit for outputting a standby voltage to the banks; and a voltage generation control circuit for output voltage generation control signals to the voltage generator according to the first and the second control signals so that the active voltage generation unit is activated only in active period.

25. The circuit as claimed in claim 24, wherein the voltage generation control circuit includes a plurality of voltage generation control units corresponding to the number of the banks for controlling the respective banks.

26. The circuit as claimed in claim 25, wherein the active period is classified into an active operating period, a read/write operating period and a precharge operating period, and the voltage generation control circuit sets a period, which is delayed for a given time after internal tRAS is secured since an active command is input, as the active operating period, sets an internal latency period, a burst length period and a latency delay period as the read/write operating period after a read/write command is input, and a period delayed for a given time after a precharge command is input as the precharge operating period.

27. The circuit as claimed in claim 24, wherein the row control unit generates row active signals, row precharge signals and row active time guarantee signals, as the first control signals, and the column control unit generates burst length information signals and column active signals, as the second control signals.

28. The circuit as claimed in claim 27, wherein each of the plurality of the voltage generation control units comprises:

a row active operation control unit that generates an active operating signal for setting the active operating period by using the row active signal and the row active time guarantee signal;

a column operation control unit that generates a read/write operation signal for setting the read/write operating period by using the column active signal and the burst length information signal;

a row precharge operation control unit that generates a precharge operating signal for setting the precharge operating period by using the row precharge signal; and a summing unit that sums the active operating signal, the read/write operation signal, and the precharge operating signal to output the voltage generation control signal.

* * * * *